(12) United States Patent
Schaffer (10) Patent No.: US 9,869,937 B2
(45) Date of Patent: Jan. 16, 2018

(54) MIRROR ARRANGEMENT FOR A LITHOGRAPHY APPARATUS AND METHOD FOR PRODUCING THE SAME

(71) Applicant: Carl Zeiss SMT GmbH, Oberkochen (DE)

(72) Inventor: Dirk Schaffer, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 217 days.

(21) Appl. No.: 14/590,328

(22) Filed: Jan. 6, 2015

(65) Prior Publication Data

US 2015/0168844 A1 Jun. 18, 2015

Related U.S. Application Data

(63) Continuation of application No. PCT/EP2013/066189, filed on Aug. 1, 2013.
(Continued)

(30) Foreign Application Priority Data

Aug. 2, 2012 (DE) .................. 10 2012 213 671

(51) Int. Cl.
*G03F 7/20* (2006.01)
*B29D 11/00* (2006.01)
(Continued)

(52) U.S. Cl.
CPC .............. *G03F 7/702* (2013.01); *B23K 26/36* (2013.01); *B29D 11/00596* (2013.01);
(Continued)

(58) Field of Classification Search
CPC .... G02B 5/0891; G02B 7/181; G02B 7/1815; G02B 7/182; G02B 7/1822; G03F 7/702; G03F 7/70891
See application file for complete search history.

(56) References Cited

U.S. PATENT DOCUMENTS 3,644,022 A 2/1972 Jagdt et al.
6,880,942 B2 4/2005 Hazelton et al.
(Continued)

FOREIGN PATENT DOCUMENTS

DE 19 52 584 B 8/1970
DE 100 00 193 A1 7/2001
(Continued)

OTHER PUBLICATIONS

International Search Report and Written Opinion for corresponding PCT Appl No. PCT/EP2013/066189, dated Nov. 5, 2013.
(Continued)

*Primary Examiner* — Steven H Whitesell Gordon
(74) *Attorney, Agent, or Firm* — Fish & Richardson P.C.

(57) ABSTRACT

A method for producing a mirror arrangement for a lithography apparatus is proposed, which comprises the following steps: producing a mirror body having a cavity delimited by a front wall, a rear wall and a side wall of the mirror body, the side wall being arranged between the front wall and the rear wall, wherein at least one supporting element is provided in the cavity between the front wall and the rear wall; and after producing the mirror body, at least partly removing the supporting element.

33 Claims, 8 Drawing Sheets

Related U.S. Application Data (60) Provisional application No. 61/678,771, filed on Aug. 2, 2012.

(51) Int. Cl.
  *G02B 7/18* (2006.01)
  *G02B 7/182* (2006.01)
  *G02B 5/08* (2006.01)
  *B23K 26/36* (2014.01)

(52) U.S. Cl.
  CPC .......... *G02B 5/0891* (2013.01); *G02B 7/181* (2013.01); *G02B 7/182* (2013.01); *G02B 7/1822* (2013.01); *Y10T 29/49815* (2015.01); *Y10T 29/49817* (2015.01)

(56) References Cited

U.S. PATENT DOCUMENTS

| | | |
|---|---|---|
| 2001/0008440 A1 | 7/2001 | Hummel et al. |
| 2003/0234993 A1 | 12/2003 | Hazelton et al. |
| 2005/0146768 A1 | 7/2005 | Wang et al. |
| 2005/0190347 A1 | 9/2005 | Suzuki |
| 2007/0035814 A1 | 2/2007 | Dinger et al. |
| 2009/0142615 A1* | 6/2009 | Ekstein .............. G03F 7/707 428/627 |
| 2013/0176614 A1 | 7/2013 | Anderl et al. |

FOREIGN PATENT DOCUMENTS

| | | | |
|---|---|---|---|
| DE | 100 52 249 A1 | 4/2002 | |
| DE | 10 2005 053 415 A1 | 5/2007 | |
| DE | 10 2010 034 476 A1 | 2/2012 | |
| DE | 10 2011 010 462 A1 | 8/2012 | |
| EP | 1569036 A2 | 8/2005 | |
| JP | 2004-056125 A | 2/2004 | |
| JP | 2004-246030 A | 9/2004 | |
| JP | 2005-244012 A | 9/2005 | |
| JP | 2005-244013 A | 9/2005 | |
| WO | WO 2012013746 A1 * | 2/2012 | ............ B82Y 10/00 |
| WO | WO 2012020020 A1 * | 2/2012 | ........... G02B 5/0808 |
| WO | WO 2013017144 A1 * | 2/2013 | ............ B22F 3/1055 |
| WO | WO 2014/020112 | 2/2014 | |

OTHER PUBLICATIONS

Japanese Office Action, with translation, for corresponding Appl No. 2015-524788, dated May 22, 2017.

* cited by examiner

MIRROR ARRANGEMENT FOR A LITHOGRAPHY APPARATUS AND METHOD FOR PRODUCING THE SAME

CROSS-REFERENCE TO RELATED APPLICATIONS

The present application is a continuation of, and claims benefit under 35 USC 120 to, international application PCT/EP2013/066189, filed Aug. 1, 2013, which claims benefit under 35 USC 119 of German Application No. DE 10 2012 213 671.1, filed Aug. 2, 2012. International application PCT/EP2013/066189 also claims priority under 35 USC 119(e) to U.S. Provisional Application No. 61/678,771, filed Aug. 2, 2012. The entire disclosure of each of these applications is incorporated by reference herein.

FIELD OF THE INVENTION

The invention relates to a mirror arrangement for a lithography apparatus, in particular an EUV lithography apparatus, and to a method for producing the same.

RELATED ART

Lithography apparatuses are used in the production of integrated circuits or ICs, for example, in order to image a mask pattern in a mask onto a substrate, such as e.g. a silicon wafer. In this case, a light beam generated by an illumination device is directed through the mask onto the substrate. An exposure lens consisting of a plurality of optical elements serves for focusing the light beam on the substrate. Examples of such lithography apparatuses are, in particular, EUV (Extreme Ultra-Violet) lithography apparatuses, which operate with optical wavelengths for the exposure in the range of 5 nm to 30 nm, e.g. 13 nm. Such short wavelengths make it possible to image tiny structures on the wafer. Since light in this wavelength range is absorbed by atmospheric gases, the beam path of such EUV lithography apparatuses is situated in a high vacuum. Furthermore, there is no material which is sufficiently transparent in the wavelength range mentioned, for which reason mirrors are used as optical elements for shaping and guiding the EUV radiation.

Figure 1:
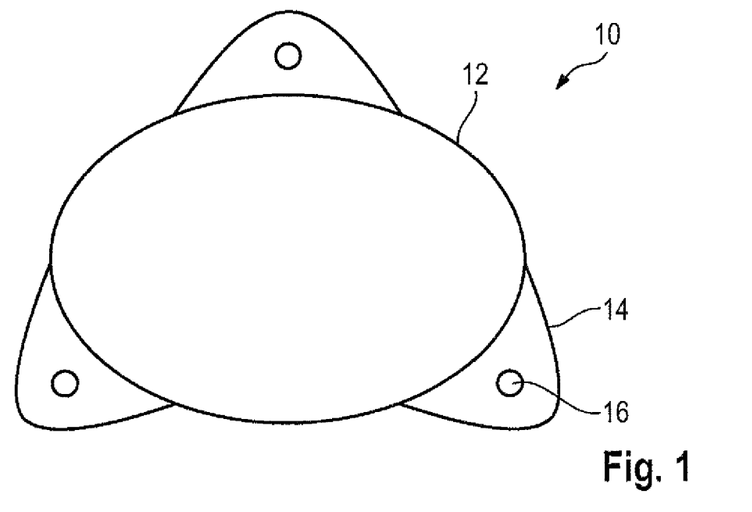
FIG. 1 is a schematic illustration of a conventional mirror arrangement.

EUV lithography apparatuses having a large numerical aperture require mirrors having a large diameter. Mirrors having a large diameter are firstly costly to produce and secondly make it more difficult to achieve mounting and actuation with little deformation. In order to achieve mounting and actuation with little deformation, it is possible to use mirrors comprising a plurality of bearing sections which are situated outside the mirror surface but in the same plane as the mirror surface. FIG. 1 shows a rear view of such a mirror arrangement as an example. The mirror arrangement 10 illustrated in FIG. 1 comprises an oval mirror substrate 12, the front side of which is provided with a reflective surface. Protuberances 14 (so-called "lugs") are provided at three locations of the circumferential edge of the mirror substrate 12. These protuberances 14 are provided integrally with the mirror substrate 12. A bearing element 16 is in each case provided on the rear or front side of the three protuberances 14. The mirror is mounted on a frame of the lithography apparatus via these three bearing elements 16. In this case, actuators can be provided between the bearing elements 16 and frame, which actuators can be used to adjust the position and the orientation of the mirror.

What is disadvantageous about the arrangement shown in FIG. 1 is that the protuberances, which lie far outside the center of gravity of the mirror arrangement 10, adversely influence the stiffness of the mirror arrangement as a result of an unfavorable mass distribution. Furthermore, the protuberances 14 contribute to the total mass of the mirror arrangement 10, with the result that the latter becomes heavier overall, which is likewise disadvantageous for the actuatability and mirror dynamics. Finally, the provision of the protuberances 14 results in a larger total diameter of the mirror arrangement 10.

U.S. Pat. No. 6,880,942 B2 (cf. FIG. 3A therein) discloses an optical element having a relatively thin mirror body 310, which is already deformed by comparatively small forces. A relatively thick substrate body 320 is arranged behind the mirror body. Inflatable bellows 330 for actuating the mirror body are arranged between the mirror body and the substrate body.

The published and examined German patent application DE 1 952 584 discloses an optical mirror having a reflection plate, a carrier plate and a honeycomb-like supporting framework between these two plates, wherein the individual cells of the supporting framework have a hexagonal cross section. The honeycomb-like supporting framework is formed from Y-shaped components welded to one another at their longitudinal edges. The Y-shaped components can be provided with pressure equalizing openings.

The German patent application DE 10 2010 034 476 A1 discloses an optical element, in particular a reflective element such as a mirror or diffraction grating, comprising a body, having a front part on the light incidence side with an optically active surface, and a rear part, and having a cavity between the front part and the rear part. The cavity extends substantially along the entire optically active surface and serves for receiving a cooling medium. The body furthermore comprises at least one inlet and at least one outlet for the cooling medium. A plurality of flow-influencing elements are arranged in a manner distributed in the cavity, the elements extending from the front part to the rear part and connecting the front part to the rear part.

The German patent application DE 100 00 193 A1 discloses an optical element of an optical system comprising at least one space with a fluid filling, the at least one space being sealed relative to the atmospheric pressure and being enclosed by delimiting surfaces. Illumination light is at least partly applied to at least one of the delimiting surfaces of the space. It is configured such that a change in the fluid pressure within the space leads to a change in the astigmatic imaging properties of the optical element. For this purpose, a fluid source is fluid-connected to the space via a fluid supply line. Furthermore, a control device for the pressure of the fluid filling is provided.

The German patent application DE 10 2011 010 462 A1 relates to an optical arrangement for an EUV projection exposure apparatus comprising an optical component having a substrate and a surface, optically active in the EUV spectral range, on a side of the substrate, and comprising a cooling device for the optical component, the cooling device having a cooling medium.

It is an object of the present invention to provide a method for producing a mirror arrangement for a lithography apparatus and such a mirror arrangement with which at least one of the problems mentioned above is solved. In particular, it is an object of the present invention to provide a method for producing a mirror arrangement for a lithography apparatus, wherein the mirror arrangement has a large diameter and a good deformation decoupling.

This object is achieved via a method for producing a mirror arrangement for a lithography apparatus, comprising the following steps:

producing a mirror body having a cavity delimited by a front wall, a rear wall and a side wall of the mirror body, the side wall being arranged between the front wall and the rear wall, wherein at least one supporting element is provided in the cavity between the front wall and the rear wall; and after producing the mirror body, at least partly removing the supporting element.

The fact that the supporting element "is provided between the front wall and the rear wall" means that the supporting element extends continuously from the front wall as far as the rear wall. Consequently, the supporting element supports the front wall and the rear wall relative to one another during the step of producing the mirror body. If producing the mirror body comprises heating the wall material in order to fuse the same, then the front wall and/or the rear wall can thus be prevented from sagging. Since the supporting element is at least partly removed after the mirror body has been produced, the supporting element does not affect the dynamic behavior of the finished mirror body or the stiffness thereof. In this case, "at least partly removed" can mean that the supporting element no longer extends continuously from the front wall as far as the rear wall, but rather is interrupted at least in one section, such that the front wall and the rear wall are mechanically decoupled from one another. By way of example, at least part of the supporting element can be removed in such a way that the supporting element is divided into a section on the front wall side and a section on the rear wall side, which do not touch one another.

Since a cavity is provided in the mirror body, the weight of the mirror arrangement can furthermore be crucially reduced. At the same time, with the circumferential side wall it is possible to ensure a sufficient stiffness of the mirror arrangement in conjunction with a large mirror diameter. In this case, the side wall can be provided along the entire circumference of the mirror arrangement. In this case, the stiffness of the mirror arrangement can be set in a simple manner via the thickness of the side wall. In this case "front wall" or "front side" denotes a wall or a side of the mirror body on which the light beam to be reflected by the mirror arrangement impinges, and "rear wall" or "rear side" denotes the wall or side facing away from the front side. In this case, "side wall" can be understood to mean the totality of outer wall and—if present—inner wall.

In one possible embodiment, the supporting element is completely removed after the mirror body has been produced. In this way, firstly the weight of the mirror body is reduced; secondly, a better symmetry of the mirror body can be achieved as a result, such that the dynamic properties of the mirror body are improved.

The process of at least partly removing the supporting element can be effected, for example, by mechanical removal, for example by machining removal using a drill or a mill or the like. In this case, the supporting element can be mechanically removed from the rear wall. The holes that remain after removal are in this case situated in the rear wall of the mirror body, such that they do not influence the beam guiding at the front side of the mirror body.

As an alternative thereto, it is also possible for the supporting element to be mechanically removed through a hole in the side wall. It is thus possible also to remove a plurality of supporting elements with only one hole. If the side wall is not completely circumferential, but rather has a cutout, then the supporting elements can also be removed without the provision of additional holes.

In accordance with a further configuration, the supporting element is at least partly removed by irradiation with laser light. In this case, it is possible to remove the supporting element even without providing holes in the mirror body. By providing an absorbent in the supporting element, such that the supporting element has a higher absorptance with respect to the laser light, it is possible to accelerate the removal using laser light. The removal using laser light can likewise be accelerated if the supporting element is at least partly removed by irradiation with laser light from a plurality of directions simultaneously.

In accordance with a further configuration, the supporting element is at least partly removed by a procedure in which an etchant is filled into the cavity, and the supporting element is chemically destroyed by the etchant. With this configuration, the mirror body is not subjected to mechanical loads during the removal of the supporting element.

The supporting element can be, for example, columnar, in the shape of a truncated cone or in the shape of a truncated pyramid. A truncated cone shape is advantageous with regard to its mechanical stability. The shape of the cross section of the supporting element can be selected depending on the method for removing the same.

It is also possible for a plurality of the supporting elements to be provided between the front wall and the rear wall. By providing a plurality of supporting elements, it is possible even for mirror bodies having a large diameter to be reliability stabilized. In this case, the supporting elements can be arranged for example on an ellipse between a midpoint of the front wall and the side wall.

Producing the mirror body can comprise for example the following steps:

arranging the side wall and the supporting element between the rear side of the front wall and the front side of the rear wall; and heating the front wall, the side wall, the rear wall and the supporting element, such that they fuse together.

In this case, the front wall, the side wall, the supporting element (or the supporting elements), and the rear wall need not necessarily be provided separately, rather it is also possible for the side wall and the supporting element to be formed integrally with the front wall or the rear wall before fusion.

Furthermore, it is possible for the supporting element to be provided with at least one predetermined breaking location. Consequently, the connection between the front wall and the rear wall can be interrupted by the supporting element at a defined location.

The method described above can furthermore comprise fitting bearing elements on the rear side of the rear wall. A space-saving mirror arrangement can be provided with bearing elements arranged on the rear side of the rear wall.

The mirror body can be produced from a material having a temperature-dependent coefficient of (linear) thermal expansion which is equal to zero at a zero crossing temperature. That means that the characteristic curve of the coefficient of thermal expansion as a function of the temperature has at least one zero crossing, namely at the zero crossing temperature. If the EUV lithography apparatus is operated at the temperature, or at least close enough to the temperature, then temperature fluctuations do not affect the geometry of the mirror arrangement, with the result that a temperature dependence of the imaging properties of the mirror arrangement is avoided or minimized. Examples of such so-called zero expansion materials are Zerodur (registered trademark of Schott AG) and ULE (registered trademark of Corning Inc.).

The object mentioned above is furthermore achieved via a mirror arrangement for an EUV lithography apparatus, comprising a mirror body having a front wall, a rear wall and a side wall arranged between the front wall and the rear wall, wherein the front wall, the rear wall and the side wall delimit an empty cavity, and wherein the ratio of the maximum lateral extent of the cavity to the maximum lateral extent of the mirror body is at least 0.75:1. The fact that the cavity is "empty" can mean that it contains no further structural elements composed of a material different from that of front wall, rear wall and side wall, in particular no such structural elements which support the front wall and the rear wall relative to one another or mechanically couple them to one another. However, it is possible for the front wall and the rear wall to be supported relative to one another by one or a plurality of structural elements composed of the same material or else by a (single) inner circumferential side wall composed of the same material. In the latter case, the cavity can be substantially ring-shaped. In other words, the cavity can therefore be regarded as that region in the mirror body which is delimited by the mirror body material. Exactly one cavity is advantageously provided; in other words, the cavity extends continuously between the opposite side walls of the mirror body. A better decoupling between front wall and rear wall is thus achieved.

The cavity arranged between the front wall and the rear wall makes it possible to achieve a good mechanical decoupling between front wall and rear wall. Furthermore, the total weight of the mirror arrangement can be reduced by the cavity. In the case of a circular base area of the cavity or mirror body, the "maximum lateral extent" corresponds to the diameter; in the case of an elliptic base area, the "maximum lateral extent" corresponds to the length of the major axis of the ellipse system. It goes without saying that the maximum lateral extent of the cavity is less than the maximum lateral extent of the mirror body.

The ratio of the maximum lateral extent of the cavity to the maximum lateral extent of the mirror body is not restricted to the range indicated above and can for example also be at least 0.8:1, at least 0.85:1, at least 0.9:1, at least 0.95:1 or at least 0.995.

The ratio of the maximum height of the cavity to the maximum height of the mirror body can be, for example, not more than 0.5:1. This ratio, too, is not restricted to this range and can also be, for example, not more than 0.2:1, not more than 0.1:1, or else not more than 0.05:1. Such a flat cavity also enables a good mechanical decoupling of front wall and rear wall. A flat cavity furthermore simplifies the production of the mirror arrangement. The cavity can furthermore be characterized in that the ratio of the maximum height to the maximum lateral extent is less than 1:5 or less than 1:10 or less than 1:20.

The mirror arrangement can furthermore comprise bearing elements for linking the mirror arrangement to a structural element of the EUV lithography apparatus, wherein the bearing elements are provided on an outer side of the rear wall. The structural element can be, for example, a load-removing frame of the EUV lithography apparatus. A space-saving mirror arrangement can thus be provided. Furthermore, in this case deformation forces that arise when the bearing elements are linked to the rear wall do not directly affect the front wall, that is to say the mirror front side.

At least one supporting element can be provided in the cavity between the front wall and the rear wall. It is therefore not absolutely necessary to remove all the supporting elements. A supporting element remaining in the cavity can serve as a stabilizing supporting location which increases the mirror stiffness overall.

The supporting element can consist of the same material as the front wall and the rear wall.

Further exemplary embodiments will be explained with reference to the accompanying drawings.

BRIEF DESCRIPTION OF THE DRAWINGS

Unless indicated otherwise, identical reference signs in the figures designate identical or functionally identical elements. Furthermore, it should be noted that the illustrations in the figures are not necessarily true to scale.

BEST MODE FOR CARRYING OUT THE INVENTION

Figure 2:
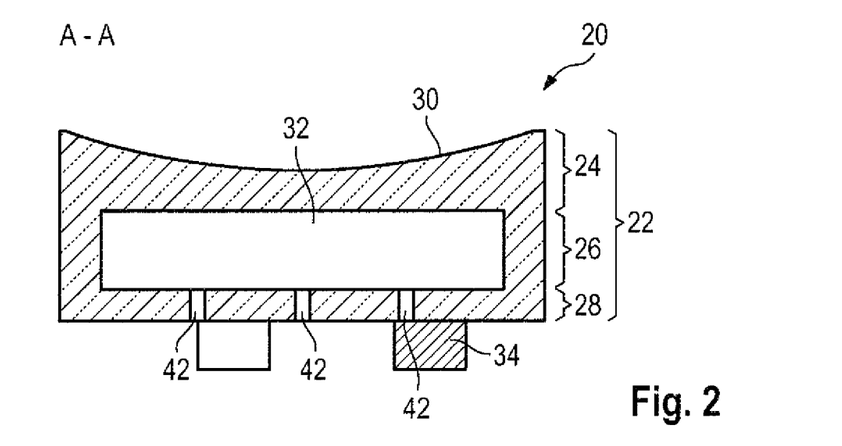
FIG. 2 shows a schematic cross-sectional illustration of a mirror arrangement produced by a method in accordance with a first exemplary embodiment.
Figures 3, 4A:
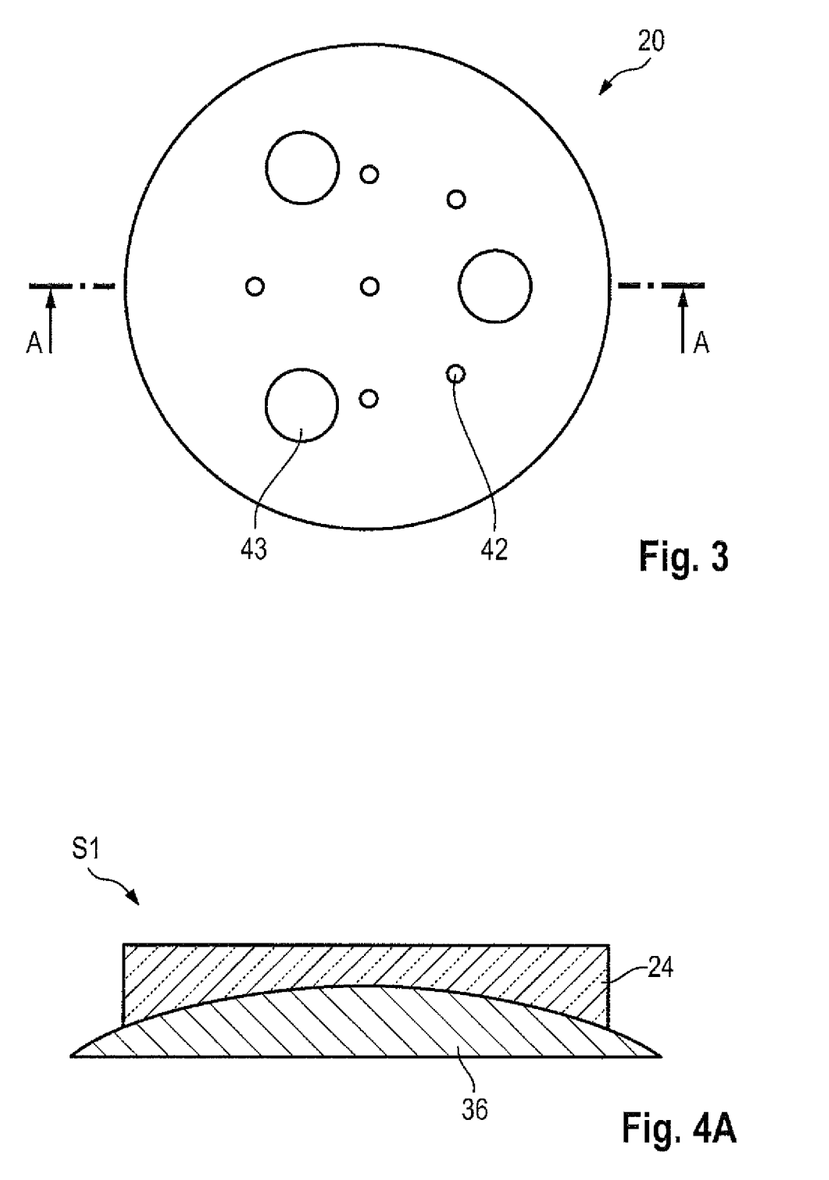
FIG. 3 is a rear view of the mirror arrangement in FIG. 2.
FIGS. 4A to 4G illustrate a first exemplary embodiment of a method for producing a mirror arrangement.

FIG. 2 is a schematic cross-sectional illustration of a mirror arrangement 20 produced by a method in accordance with a first exemplary embodiment, and FIG. 3 is a rear view of the mirror arrangement 20. The mirror arrangement 20 described here is suitable for beam guiding within a lithography apparatus, in particular an EUV lithography apparatus.

In this embodiment, the mirror arrangement 20 comprises a mirror body 22 having a front wall 24, a side wall 26 and a rear wall 28. In the example illustrated, the mirror body 22 is circular in plan view, see FIG. 3, but can also be oval, elliptic or reniform. Furthermore, the mirror body 22 is designed as a mirror body of a concave mirror. Materials whose coefficient of thermal expansion at the operating temperature is close to zero are suitable, in particular, as material for the mirror body 22. Such materials are also designated as "zero expansion materials". Examples of such materials are glass ceramic materials, titanium-doped quartz glass or cordierite provided with suitable additives.

A reflective coating 30 is provided on the front side of the front wall 24, that is to say on the side facing the beam path, the reflective coating being suitable for reflecting light in the EUV range. The side wall 26 is provided on the rear side of the front wall 24, which side wall can be embodied for example in a ring-shaped fashion and circumferentially around the edge of the front wall 24. The rear wall 28 is provided on the rear side of the side wall 26. The front wall 24, the side wall 26 and the rear wall 28 are formed integrally and therefore consist of the same material. The front wall 24, the side wall 26 and the rear wall 28 of the mirror body 22 delimit a single cavity 32. In the exemplary embodiment illustrated, the cavity is empty, that is to say it contains no further structural elements composed of a material different from that of front wall, rear wall and side wall, in particular no such structural elements which support the front wall and the rear wall relative to one another or mechanically coupled onto one another.

The mirror arrangement 20 is mounted on a structural element (not illustrated in more specific detail) of the lithography apparatus via a plurality of bearing elements 34. By way of example, it can be mounted on a force-dissipating frame of the lithography apparatus. This mounting can be active or passive, and the bearing elements 34 can be mounted on the frame of the lithography apparatus via further coupling elements. In the case of an active mounting, the distal ends of the bearing elements 34 can in each case be fixed to one side of an actuator, wherein the other side of the actuator is fixed to the frame. This enables an adjustment of the position and of the orientation of the mirror arrangement 20. In the case of a passive mounting, the distal ends of the bearing elements 34 can in each case be fixed to one side of a damping element, such as e.g. a spring element, wherein the other side of the spring element is fixed to the frame. This makes it possible to damp the transmission of vibrations and the like to the mirror arrangement 20. A combination of active and passive mounting is also possible.

The bearing elements 34 can be substantially cylindrical, for example, wherein one of the flat sides of the cylindrical shape is in each case linked to the rear wall 28. The connecting areas between the bearing elements 34 and the rear wall 28 are also designated hereinafter as "linking areas". The bearing elements 34 can be hollow-cylindrical, which contributes to a further reduction of the total weight. However, they can also be embodied as a solid cylinder. If the bearing elements 34 are hollow-cylindrical at least in sections, that is to say are hollow-cylindrical e.g. at least in the region of linking, then the linking area can be reduced, which makes it possible to reduce the local strains during linking. The bearing elements 34 can be produced from a different material from that of the mirror body 22. By way of example, they can be produced from a metal having a low coefficient of thermal expansion, such as e.g. Invar (an iron-nickel alloy). A well-balanced mounting in conjunction with comparatively low weight arises if three bearing elements 34 are linked to three suitable locations of the rear wall 28. However, it is also possible to provide four or more bearing elements 34.

In general, the arrangement described here can be applied to mirrors of all sizes, but the effect—described further below—of the deformation decoupling is particularly advantageous in the case of mirrors having large diameters, and that is to say in the case of mirrors whose maximum diameter is e.g. greater than 30 cm or greater than 40 cm and is up to 100 cm or more.

On account of the cavity 32, the total weight of the mirror arrangement 20 can be considerably reduced, such that the mirror arrangement 20 is particularly well suited to large mirror geometries. Furthermore, the total diameter can be reduced relative to conventional mirror arrangements, since there is no need to provide any protuberances or lugs and, consequently, the linking areas can be arranged closer to the reflective surface 30 of the mirror arrangement 20. At the same time, the ring-shaped side wall 26 has a stiffening effect, such that a comparatively high stiffness of the mirror arrangement 20 can be achieved even with a relatively low weight.

Furthermore, an extensive deformation decoupling is achieved by the linking of the bearing elements 34 to the outer side of the rear wall 28. In this regard, local strains can occur for example at the linking areas between the bearing elements 34 and the rear wall 28. The strains can occur for example during production, for example if the adhesive used for adhesively bonding the bearing elements 214 to the rear wall 28 shrinks. Since the bearing elements 34 are not provided at the level of the front wall 24, but rather are linked to the rear wall 28 adjacent behind the front wall, the forces occurring on account of such local strains are also not transmitted directly to the mirror body and the reflective surface provided thereon. Rather, the rear wall 28 has a certain elasticity, on account of which a deformation decoupling can be achieved. Furthermore, this arrangement also achieves mounting and/or actuation with little deformation, since forces occurring during mounting and/or during actuation are largely decoupled from the front wall 24 as a result of the bearing elements 34 being linked to the rear wall 28.

In one possible method for producing the integral or monolithic mirror body 22, the front wall 24, the side wall 26 and the rear wall 28 are stacked one on top of another, heated, and fused together. This gives rise to a cohesive connection between the front wall 24, the side wall 26 and the rear wall 28, that is to say a connection in which the front wall 24, the side wall 26 and the rear wall 28 are held together by atomic or molecular forces and which can be separated only by the destruction of the connecting mechanism.

In the case of mirrors having large diameters, however, in this method the problem arises that the individual elements have to be heated to or close to the melting point in order to be fused together, and the front wall 24 or the rear wall 28 sags on account of their low stiffness at such high temperatures and can thus change their shape. In the case of the front wall 24, however, even tiny deformations should be avoided, since they are difficult to correct internally and can thus adversely affect the imaging properties of the mirror, and in the case of the rear wall 28, too, deformations can affect the dynamic behavior of the mirror and are therefore undesirable.

In accordance with a method according to the invention for producing a mirror, supporting elements are provided between the front wall 24 and the rear wall 28, which supporting elements support the mirror body 22 during heating. These supporting elements are removed again after heating.

A first exemplary embodiment of this method is explained below with FIGS. 4A to 4G.

In a first step S1, the front wall 24 of the mirror body 22 is placed onto a substrate 36, see FIG. 4A. The substrate 36 is produced from a material which maintains its shape even at the temperature of the subsequent heating process and does not fuse with the front wall 24. Furthermore, the substrate 36 has a shape substantially corresponding to the shape of the front side of the front wall 24 which is placed on it.

Figure 4B:
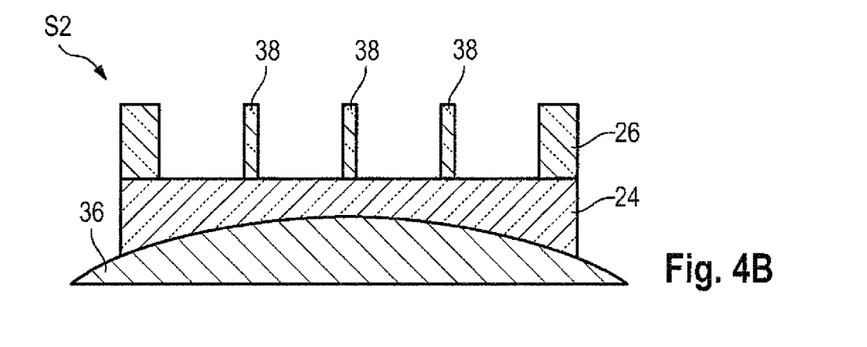

In a second step S2, the side wall 26 and the supporting elements 38 are placed onto the rear side of the front wall 24, see FIG. 4B. For this purpose, it is advantageous if the rear side of the front wall 24 is substantially planar. It is furthermore also possible for recesses to be provided in the rear side of the front wall 24, into which recesses the supporting elements 38 and/or the side wall can be inserted. In the example illustrated, the supporting elements 38 are solid-cylindrical, but can also have other shapes, as will be discussed in even greater detail below. The height of the supporting elements 38 is substantially identical to the height of the side wall 26. In the example illustrated, one supporting element 38 is provided substantially at the midpoint of the front wall 24 and further (e.g. eight) supporting elements 38 are provided on a circle between the midpoint and the side wall 26.

Figure 4C:
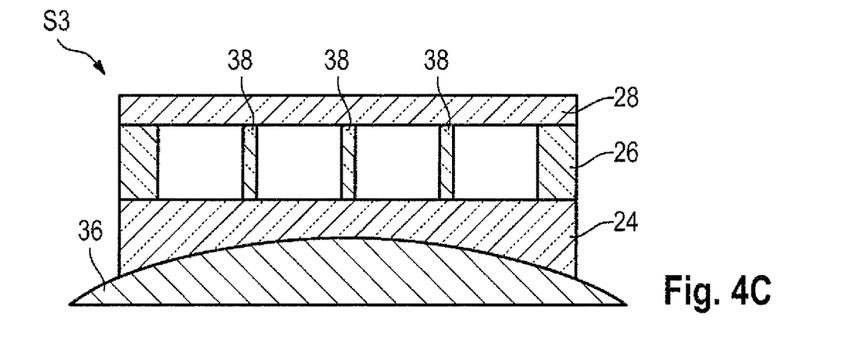

In a third step S3, the rear wall 28 is placed onto the side wall 26 and the supporting elements 38, see FIG. 4C. In this case, the rear wall 28 can terminate flush with the side wall 26, but can also project beyond the latter. The supporting elements 38 are thus arranged in the cavity 32 formed by front wall 24, side wall 26 and rear wall 28.

Figure 4D:
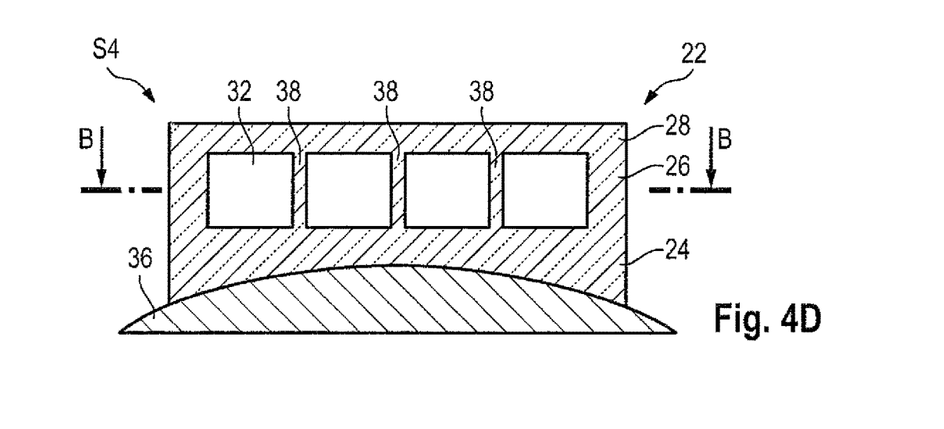

In a fourth step S4, the front wall 24, the side wall 26, the rear wall 28 and the supporting elements 38 are fused together and an integral mirror body 22 is thus formed, see FIG. 4D. For this purpose, the temperature is increased for example to the melting point and maintained for a specific time (e.g. 10 min). Since the supporting elements 38 are provided between the front wall 24 and the rear wall 28, this prevents the rear wall 28 from sagging on account of its own weight and being deformed.

Although it is also possible to leave the supporting elements 38 in the cavity, the supporting elements 38 influence the dynamic behavior of the mirror body 22. In particular, the supporting elements 38 make it more difficult to achieve the mechanical decoupling of front wall 24 and rear wall 28. For this reason, in a fifth step S5, the supporting elements 38 are at least partly removed after the cooling of the mirror body 22, see FIG. 4E. In this case, "at least partly removed" can mean that at least one portion of the supporting elements 38 is removed, such that the supporting elements 38 no longer mechanically couple the front wall 24 and rear wall 28 to one another. It is also possible to completely remove the supporting elements 38. As a result of the complete removal of the supporting elements 38, firstly the weight of the mirror body is reduced; secondly, a better symmetry of the mirror body can be ensured as a result, such that the dynamic properties of the mirror body are improved.

Figure 4E:
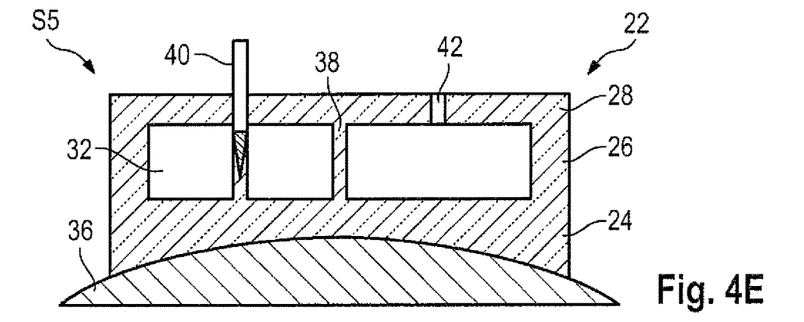

The at least partial removal of the supporting elements therefore achieves a decoupling of front wall 24 and rear wall 28. In the exemplary embodiment illustrated, for this purpose, the supporting elements 38 are mechanically removed from the rear side of the rear wall 28. For this purpose, above the supporting elements 38 holes 42 are introduced in the rear wall 28 using a suitable tool 40, e.g. a glass drill, a glass mill or a grinding tool, and then the supporting elements 38 are removed by machining using a tool 40. Furthermore it is possible to remove the supporting elements 38 through a plurality of drilled holes having progressively increasing drilling diameters, that is to say for example firstly to make a predrilled hole using a tool with a drilling diameter that is smaller than the diameter of the supporting elements 38, and then to remove the supporting elements 38 in a main drilled hole using a tool whose diameter corresponds at least to the diameter of the supporting elements 38.

Figure 4F:
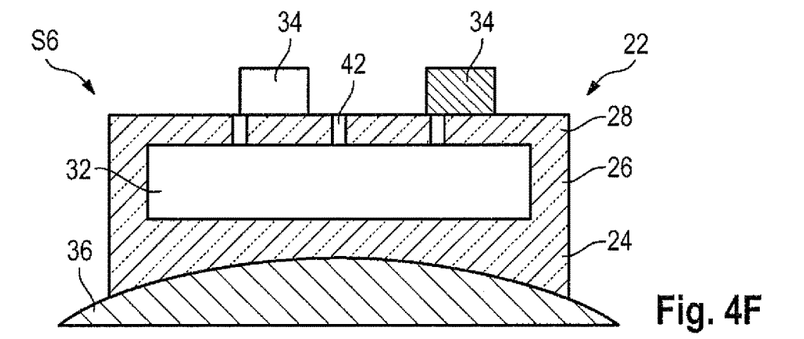

In the sixth step S6, the above-described bearing elements 34 are fixed to the rear side of the rear wall 28, see FIG. 4F. The bearing elements 34 can be adhesively bonded or soldered onto the rear wall 28, for example.

Figure 4G:
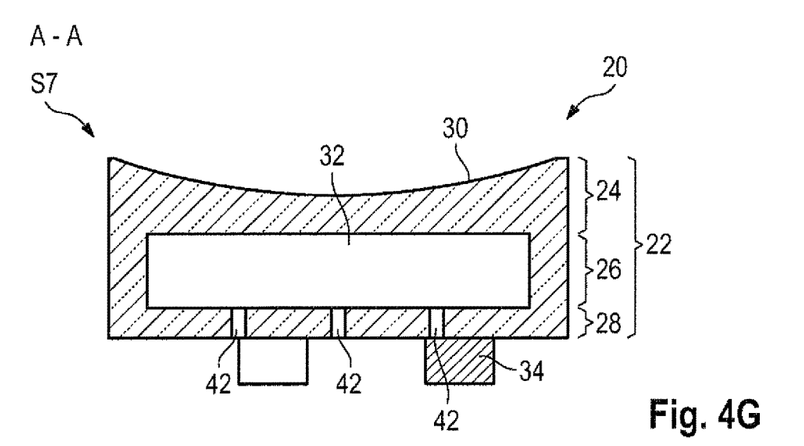

In the seventh and last step S7, the mirror body 22 is taken from the substrate 36, and the reflective layer 30 is applied to the front side of the front wall 24, see FIG. 4G. The mirror arrangement 20 illustrated in FIGS. 2 and 3 is thus completed. Optionally, a further step for the final processing of the mirror surface can also be effected before the sixth or seventh step.

Via the method in accordance with the exemplary embodiment described above, the front wall 24 and the rear wall 28 are supported relative to one another during the fusion of the individual parts of the mirror body 22, such that sagging of large-area parts can be avoided. Since the supporting elements 38 are at least partly removed after fusion, they have no or only an insignificant effect on the natural frequency of the mirror body 22, and the front wall 24 and the rear wall 28 can be decoupled from one another. Although holes 42 remain in the rear wall 28 after the removal of the supporting elements 38 from the rear wall 28, the holes 42 are comparatively small, such that they have no or only an insignificant effect on the natural frequency and the dynamic properties of the mirror body. In particular, the stiffness of the mirror body 22 is only insignificantly reduced by the holes 42.

The number and the arrangement of the supporting elements 38 can be determined depending on the geometry of the mirror body 22. In this regard, in the case of relatively small mirror bodies it may suffice if only one supporting element is provided in the center of the mirror body 22. In this case, the "center of the mirror body" can denote, for example, that location of the mirror body at which the front wall 24 or the rear wall 28 sags the most during heating owing to inherent weight deformation. In the case of mirror bodies having a very large area, in addition or as an alternative to the supporting element 38 in the center of the mirror body 22, a plurality of supporting elements 38 can be provided between the center of the mirror body 22 and the circumferential side wall 26. The supporting elements 38 can be arranged, depending on the basic shape of the mirror body 22, for example in a circle or an ellipse around the center of the mirror body 22. In the case of particularly large mirror arrangements, it is also possible to provide the supporting elements 38 in two or more rows between the center of the mirror body 22 and the circumferential side wall 26.

Figure 5:
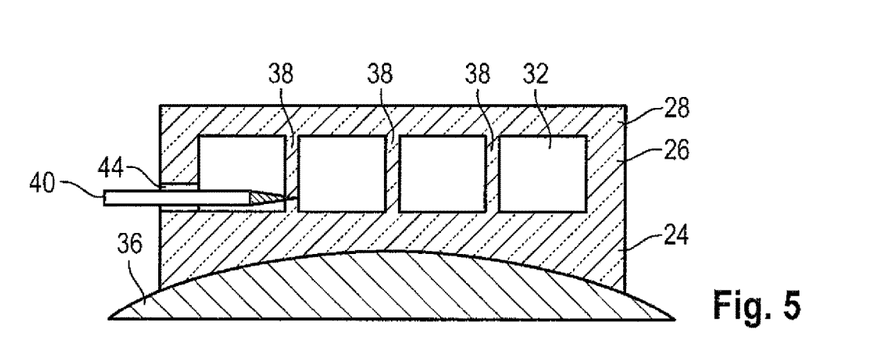
FIG. 5 shows one alternative configuration of the step for removing the supporting elements in the first exemplary embodiment.

FIG. 5 shows an alternative configuration of step S5 for removing the supporting elements 38 in the exemplary embodiment described above. In accordance with this alternative configuration, the supporting elements 38 are mechanically removed and at least partly removed from the side wall 26, rather than from the rear wall 28. For this purpose, firstly one or a plurality of holes 44 are provided in the side wall 26, through which the above-described tool 40 is introduced and the supporting elements 38 are removed. In this case, the width of the holes 44 can correspond to the width of the supporting elements 38.

What is advantageous about this configuration is that a plurality of supporting elements 38 can be removed through one hole 44 in the side wall 26, such that, finally, fewer holes remain in the mirror body 22. If the side wall 26 is not completely circumferential, but rather has a cutout, then the tool 40 can be introduced through the cutout even without the provision of additional holes. However, in this configuration, in the case of supporting elements having a round cross section, the tool 40 acts on the round side wall of the supporting elements 38, which makes the removal process more difficult. In order to prevent the tool 40 from slipping on the supporting elements 38, therefore, predrilled holes or small recesses or the like can be provided in the supporting elements 38 and the tip of the tool 40 can be introduced into them. Furthermore, guide trenches can also be provided on the rear side of the front wall 24, along which guide trenches the tool 40 can be guided from the side wall 26 as far as the individual supporting elements 38. Furthermore, during the removal of an end of the supporting elements 38 from the side, the highest forces act at the opposite end of the supporting elements 38, with the result that the latter can ultimately break away in this region. In order to prevent uncontrolled breaking-away and/or in order to simplify the removal process, one or a plurality of predetermined breaking locations can be provided along the supporting elements 38, such that the supporting elements 38 break at the predetermined breaking locations in the event of a specific shear force being exceeded during removal. It is furthermore also possible to provide two predetermined breaking locations along the axis of the supporting elements 38, and to break out that section of the supporting elements 38 which is located between the predetermined breaking locations using a plunger introduced through the hole 44 in the side wall 26.

Figure 6:
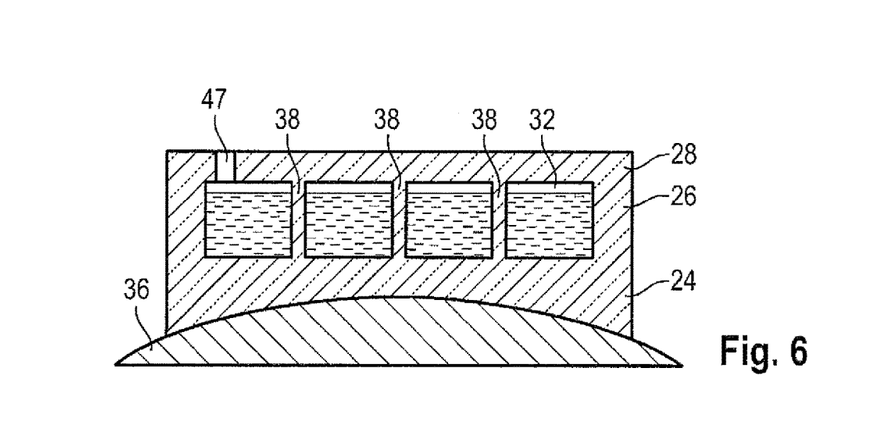
FIG. 6 shows a further alternative configuration of the step for removing the supporting elements in the first exemplary embodiment.

FIG. 6 shows a further alternative configuration of step S5 for removing the supporting elements 38 in the exemplary embodiment described above. In accordance with this alternative configuration, the supporting elements 38 are not removed mechanically but rather chemically by a procedure in which a liquid etchant is filled into the cavity 32 through a hole 47 provided in the rear wall 28. In this case, the etchant can be any agent which is suitable for chemically removing the supporting elements 38, such as e.g. hydrofluoric acid. Although in this configuration the inner walls of the cavity 32 are also attacked by the etchant, this can be taken into account in the dimensioning of the elements delimiting the cavity 32. Furthermore, it is possible to minimize the etching time by minimizing the diameter to be etched of the supporting elements 38. By way of example, as described above, predetermined breaking locations can be provided, or the supporting elements 38 can be hollow-cylindrical. The cavity 32 can be completely filled with the etchant during the etching process, as a result of which a uniform etching is achieved along all walls of the cavity 32 and the supporting elements 38. However, it is likewise possible to fill the cavity 32 with etchant only up to a specific filling level, and to chemically remove only a lower section of the supporting elements 38.

What is advantageous about this configuration is that, during the removal of the supporting elements 38, the mirror body 22 is not subjected to mechanical loads that occur in the above-described configurations on account of the drilling forces.

Figure 7:
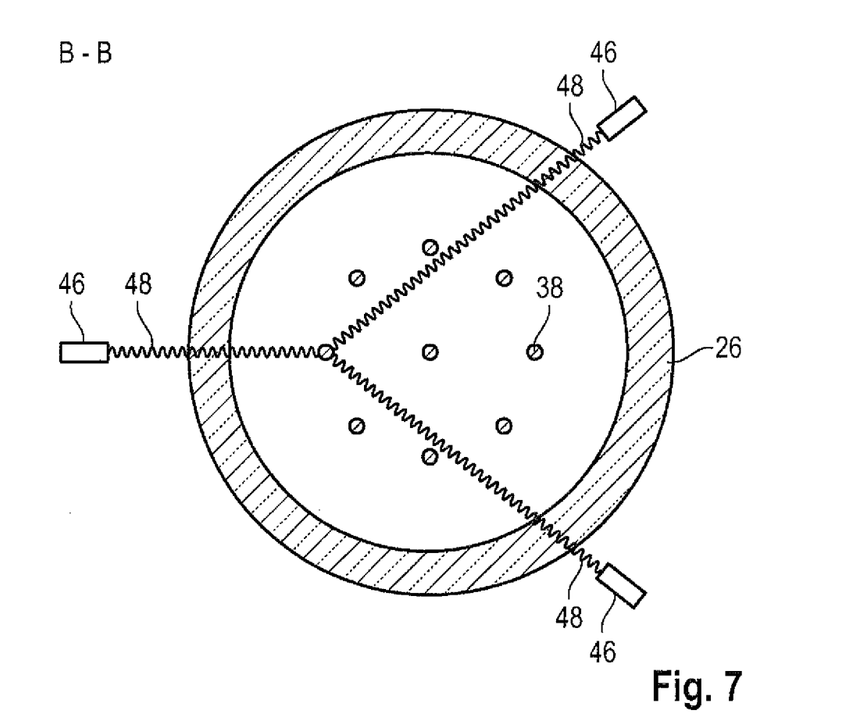
FIG. 7 shows a further alternative configuration of the step for removing the supporting elements in the first exemplary embodiment.

FIG. 7 shows a further alternative configuration of step S5 for removing the supporting elements 38 in the exemplary embodiment described above. FIG. 7 shows a cross-sectional view along the sectional line B-B in FIG. 4D. In accordance with this alternative configuration, the supporting elements 38 are at least partly removed by irradiation with laser light. For this purpose, one or a plurality of laser sources 46 are provided outside the mirror body and generate laser light 48 that can be directed onto the supporting elements 38. It should be taken into consideration that the arrangement of the laser sources 46 in FIG. 7 is merely schematic, and in particular refraction effects and the like of the laser at the side wall 26 have not been taken into account.

The laser light 48 penetrates through the vitreous side wall 26. In this case, the laser light 48 can be set up in such a way that it is focused onto the supporting element 38 to be removed and penetrates through the side wall 26 in the unfocused state. Consequently, the side wall 26 is heated only to an insignificant extent on account of the laser light 48. The supporting element 38 to be removed absorbs the laser light 48, and is thereby heated to the melting point. During the removal of the supporting elements 38 using laser light 48, there is no need to provide any holes in the mirror body 22. In this case, too, a region having a reduced diameter in the manner of a predetermined breaking location or the like can be provided at the corresponding location of the supporting element 38. It is possible to melt through the supporting elements 38 by irradiation using only one laser source 46, but it is advantageous to use two or more laser sources 46 in order to be able to direct laser light 48 onto the supporting elements 38 simultaneously from a plurality of directions and thus to accelerate the removal process. It is likewise possible to split the laser light from only one laser source into a plurality of light beams using a beam splitter or the like, and to direct the light beams onto the supporting element 38 to be removed from a plurality of directions with the aid of mirrors. In this case, only one laser source has to be provided, which enables more cost-effective production.

In order to accelerate the removal process even further, it is possible to set up the supporting elements 38 in such a way that they better absorb the laser light. By way of example, it is possible to admix with the supporting elements 38 corresponding pigments or other absorbents which absorb light in the wavelength range of the laser light 48.

Figure 8A:
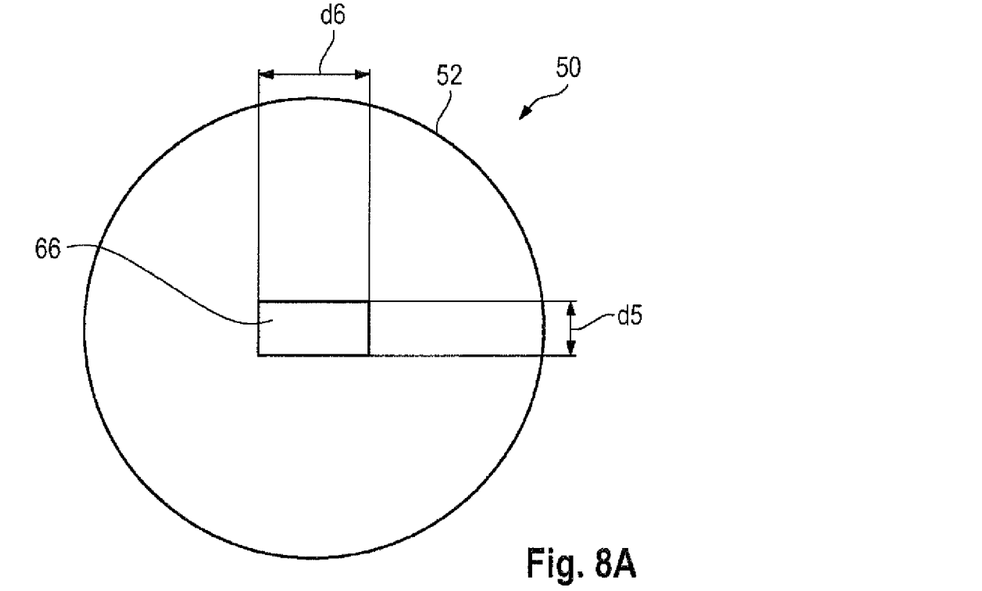
FIG. 8A shows a plan view of a mirror body produced by a method in accordance with a second exemplary embodiment.
Figure 8B:
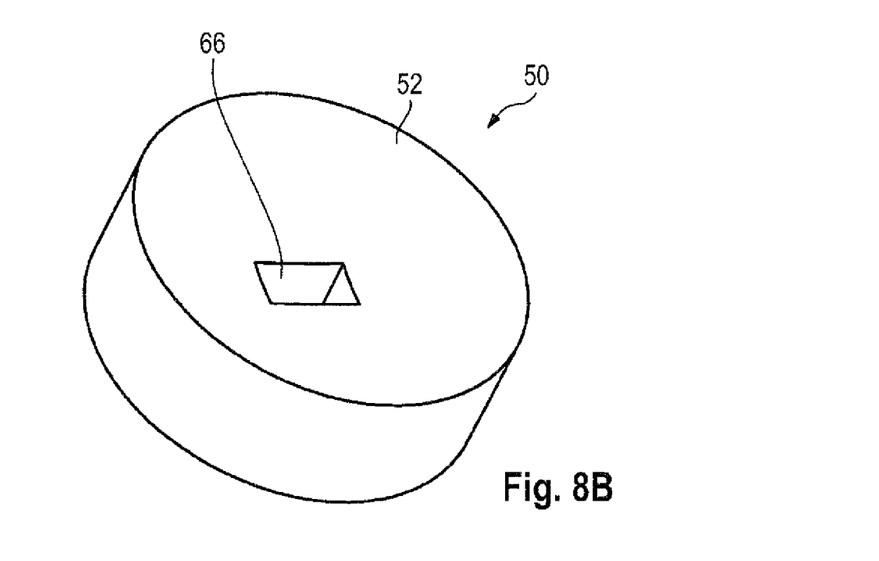
FIG. 8B shows a perspective view of this mirror body 52.
Figure 9A:
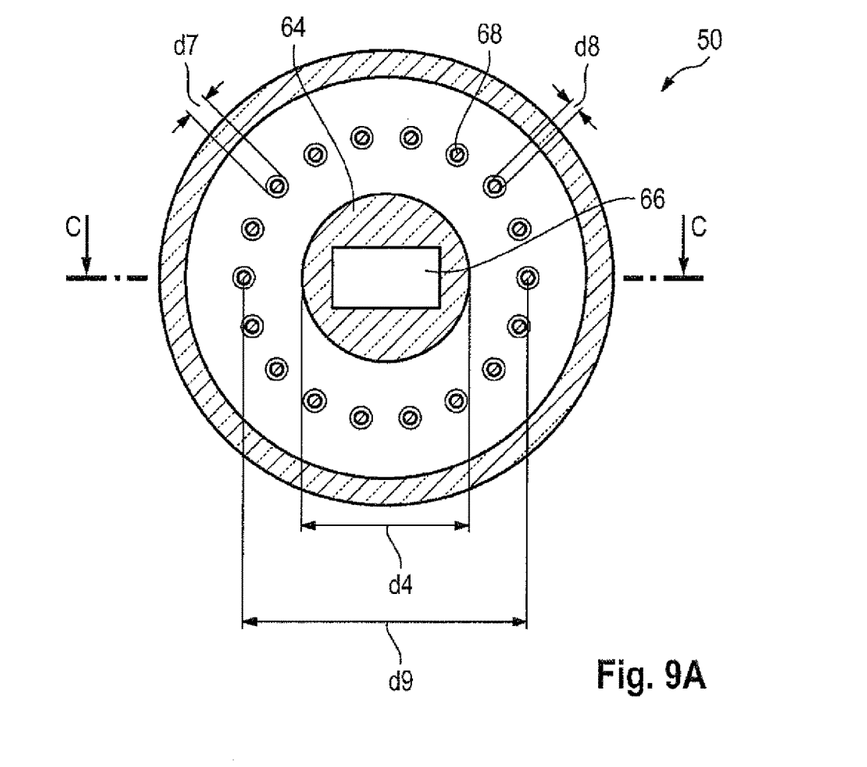
FIG. 9A shows a sectional view through the cavity in the mirror body in FIGS. 8A and 8B.
Figure 9B:
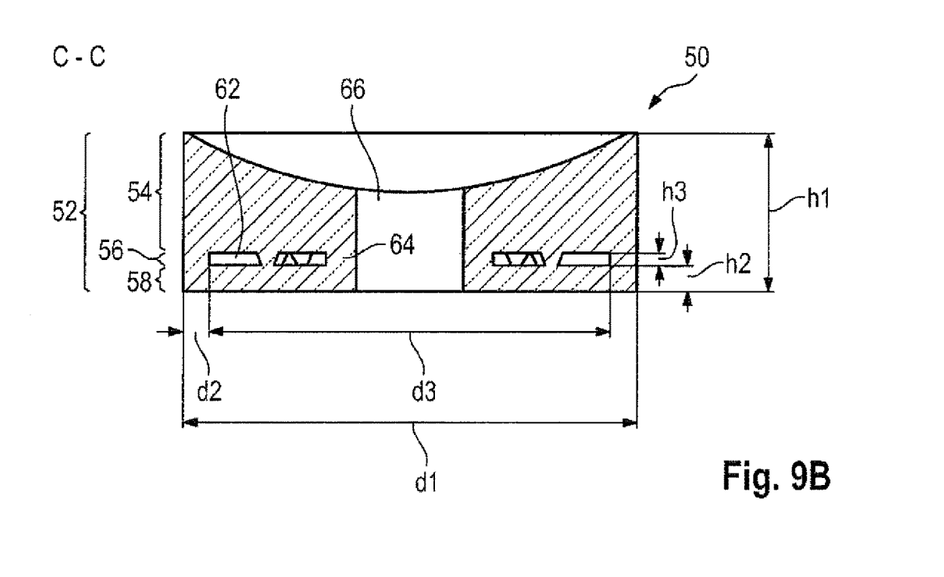
FIG. 9B shows a sectional view through the mirror body along the line C-C in FIG. 9A.

FIGS. 8A, 8B, 9A and 9B show a mirror arrangement 50 comprising a mirror body 52 in accordance with a second exemplary embodiment, to be precise before the removal of the supporting elements. In this case, FIG. 8A shows a plan view of the mirror body 52, FIG. 8B shows a perspective view of the mirror body 52, FIG. 9A shows a sectional view through the cavity in the mirror body 52, and FIG. 9B shows a sectional view through the mirror body 52 along the line A-A in FIG. 9A. The mirror body 52 also comprises a front wall 54, side walls 56 (64) and a rear wall 58, which delimit a cavity 62.

As in the first exemplary embodiment as well, the mirror body 52 is circular in plan view and is embodied as a concave mirror. The diameter d1 of the mirror body 52 can be for example 400 to 1000 mm, e.g. approximately 800 mm. The thickness d2 of the side wall 56 can be for example 10 to 150, e.g. approximately 100 mm. The ratio of the diameter d3 (that is to say the maximum lateral extent) of the cavity 62 to the diameter d1 (that is to say the maximum lateral extent) of the mirror body 52 can in this case be at least 0.75:1, at least 0.8:1 or else at least 0.85:1. Consequently, the diameter d3 of the cavity 62 is for example 300 to 980 mm, e.g. approximately 600 mm.

The maximum height h1 of the mirror body 52 can be for example 200 to 400 mm, e.g. 300 mm. The maximum height h2 of the rear wall can be for example 20 to 80 mm, e.g. 40 mm. The maximum height h3 of the side wall can be for example 2 to 50 mm, e.g. 20 mm. In this case, the ratio of the maximum height h3 of the cavity 62 to the maximum height h1 of the mirror body 52 can be, for example, not more than 0.5:1, not more than 0.1:1 or else not more than 0.05:1.

The mirror body 52 in accordance with this second exemplary embodiment differs from the mirror body 22 in the first exemplary embodiment in that a circular inner side wall 64 is provided around the mirror center and delimits the cavity 62 radially inward.

Furthermore, a rectangular through-hole 66 is provided through the center of the mirror body 52, that is to say through the front wall 54, the inner side wall 64 and the rear wall 58. The circular inner side wall 64 can have for example an external diameter d4 of 200 to 400 mm, e.g. 300 mm. The through-hole 66 can have an aspect ratio of 1:2 and have for example a height d5 of 100 mm and a width d6 of 200 mm. Through the through-holes 66, the light beam can enter the lithography apparatus. By way of example, the light reflected by the mirror arrangement with this mirror body 52 can be reflected by a further mirror and then passed through the through-hole 66. An opposite beam path is also conceivable.

Such mirrors having a through-hole near the mirror center can be used in particular as near-field mirrors and have a correspondingly large diameter. For the reasons described above it is therefore advantageous to provide the cavity 62 in the interior of the mirror body 52, and to provide supporting elements 68 during the production of the mirror body 52, the supporting elements being removed again after the fusion of the individual elements of the mirror body 52.

The supporting elements 68 differ from the supporting elements 38 of the above-described exemplary embodiment to the effect that they are not embodied in a columnar fashion, but rather in the shape of a truncated cone. In this case, the supporting elements 68 have at their base area a diameter d7 of, for example, 25 to 50 mm, e.g. 40 mm, and at their apex a diameter d8 of, for example, 5 to 30 mm, e.g. 20 mm. In this case, the supporting elements 68 are arranged on a circle (more generally, an ellipse) having a diameter d9 of e.g. 450 mm.

The production of the mirror body 52 made from the front wall 54, the side wall 56 and the rear wall 58 is effected correspondingly with the steps described for the first exemplary embodiment. Therefore, the same advantages arise with regard to the support by the supporting elements 68 during fusion.

On account of their configuration in the form of a truncated cone, the supporting elements 68 can be positioned more easily on the rear side of the front wall 54. In particular, there is no risk of the supporting elements falling over during the placement of the rear wall 58. A stabler construction than in the first exemplary embodiment is therefore possible. Furthermore, the truncated cone apexes of the supporting elements 68 are arranged on the side of the rear wall 58, such that the supporting elements 68 can be removed using a tool whose removal diameter corresponds to the diameter of the truncated cone apexes, that is to say can be smaller than the diameter at the base of the truncated cones. Consequently, the holes remaining in the rear wall 58 are also comparatively small, and thus influence the dynamic behavior of the mirror body 52 even less.

In the second exemplary embodiment in accordance with FIGS. 8 and 9, the cavity is smaller than in the first exemplary embodiment. The mirror body 62 therefore has a greater stiffness, but the weight saving on account of the cavity 62 is smaller.

It should be taken into consideration that the embodiments described above are merely by way of example and can be varied diversely in the context of the scope of protection of the patent claims. In particular, the features of the embodiments described above can also be combined with one another.

By way of example, the side wall 26 in the first exemplary embodiment need not necessarily be provided at the edge of the mirror body 22, but rather can also be arranged in a manner spaced apart from the edge in a manner offset radially inward. It is thus possible to achieve a larger mirror surface in conjunction with lower weight. Furthermore, the side wall 26 can also be embodied in two parts, and comprise an outer side wall 56 and an inner side wall 64.

Furthermore, it is also possible firstly to produce the front wall 24 (54), the side wall 26 (56) and the supporting elements 38 (68) monolithically from one piece, e.g. by fusion of corresponding raw elements, by removal of the material corresponding to the cavity 32 (62), or by casting in a corresponding mold.

In the exemplary embodiments presented above, the front wall 24 (54) was furthermore placed on the substrate 36, but it is also possible, of course, to place the rear side of the rear wall 28 (58) on a correspondingly shaped substrate and to position thereon the supporting elements and the front wall. Moreover, the rear wall 28 (58) need not necessarily be embodied as planar, but rather can follow for example the curvature of the optical surface of the front wall 24 (54).

LIST OF REFERENCE SIGNS

10 Mirror arrangement
12 Mirror substrate
14 Protuberances
16 Bearing elements
20 Mirror arrangement
22 Mirror body
24 Front wall
26 Side wall
28 Rear wall
30 Reflective coating
32 Cavity
34 Bearing elements
36 Substrate
38 Supporting elements
40 Tool
42 Holes
44 Hole
46 Laser source
48 Laser light
50 Mirror arrangement
52 Mirror body
54 Front wall
56 Side wall
58 Rear wall
62 Cavity
64 Inner side wall
66 Through-hole
68 Supporting elements

The invention claimed is:

1. An arrangement, comprising:
    a mirror body having a single cavity delimited by a front wall, a rear wall and a side wall between the front and rear walls,
    wherein:
        the side wall does not have a hole;
        the mirror body comprises a glass ceramic; and
        a ratio of a maximum lateral extent of the cavity to a maximum lateral extent of the mirror body is at least 0.75:1.

2. The arrangement of claim 1, wherein the ratio of the maximum lateral extent of the cavity to the maximum lateral extent of the mirror body is at least 0.85:1.

3. The arrangement of claim 1, wherein a ratio of a maximum height of the cavity to a maximum height of the mirror body is not more than 0.5:1.

4. The arrangement of claim 1, wherein a ratio of a maximum height of the cavity to a maximum height of the mirror body is not more than 1:5.

5. The arrangement of claim 1, wherein the glass ceramic has a temperature dependent coefficient of thermal expansion which is equal to zero at a zero crossing temperature.

6. The arrangement of claim 1, further comprising bearing elements configured to link the mirror body to a structural element of an EUV lithography apparatus, wherein the bearing elements are supported by an outer side of the rear wall of the mirror body.

7. The arrangement of claim 1, further comprising a supporting element in the cavity between the front and rear walls.

8. The arrangement of claim 1, further comprising a supporting element in the cavity between the front and rear walls, wherein the supporting element has a shape selected from the group consisting of a column, a truncated pyramid, and a truncated cone.

9. The arrangement of claim 1, further comprising a supporting element in the cavity between the front and rear walls, wherein the supporting element, the front wall and the side wall comprise a same material.

10. An apparatus, comprising:
the arrangement of claim 1,
wherein the apparatus is an EUV lithography apparatus.

11. The apparatus of claim 10, wherein the apparatus comprises an illumination device and an exposure element.

12. The arrangement of claim 1, wherein the glass ceramic comprises titanium doped quartz glass.

13. The arrangement of claim 1, wherein the glass ceramic comprises cordierite.

14. The arrangement of claim 13, wherein the cordierite comprises at least one additive.

15. The arrangement of claim 1, wherein the glass ceramic comprises a titania-silicate glass.

16. The arrangement of claim 1, wherein the glass ceramic comprises a lithium-aluminosilicate glass.

17. The arrangement of claim 1, wherein the sidewall is devoid of openings.

18. The arrangement of claim 1, wherein the sidewall is completely solid.

19. The arrangement of claim 1, wherein the cavity is devoid of solid material.

20. The arrangement of claim 1, wherein the sidewalls contact an outer atmosphere of the arrangement.

21. An arrangement, comprising:
a mirror body having a single cavity delimited by a front wall, a rear wall and a side wall between the front and rear walls,
wherein:
the sidewall does not have a hole; and
a ratio of a maximum lateral extent of the cavity to a maximum lateral extent of the mirror body is at least 0.75:1.

22. The arrangement of claim 21, wherein the ratio of the maximum lateral extent of the cavity to the maximum lateral extent of the mirror body is at least 0.85:1.

23. The arrangement of claim 21, wherein a ratio of a maximum height of the cavity to a maximum height of the mirror body is not more than 0.5:1.

24. The arrangement of claim 21, wherein a ratio of a maximum height of the cavity to a maximum height of the mirror body is not more than 1:5.

25. The arrangement of claim 21, further comprising bearing elements configured to link the mirror body to a structural element of an EUV lithography apparatus, wherein the bearing elements are supported by an outer side of the rear wall of the mirror body.

26. The arrangement of claim 21, further comprising a supporting element in the cavity between the front and rear walls.

27. The arrangement of claim 21, further comprising a supporting element in the cavity between the front and rear walls, wherein the supporting element has a shape selected from the group consisting of a column, a truncated pyramid, and a truncated cone.

28. The arrangement of claim 21, further comprising a supporting element in the cavity between the front and rear walls, wherein the supporting element, the front wall and the side wall comprise a same material.

29. The arrangement of claim 21, wherein the sidewall is completely solid.

30. The arrangement of claim 21, wherein the cavity is devoid of solid material.

31. The arrangement of claim 21, wherein the sidewalls contact an outer atmosphere of the arrangement.

32. An apparatus, comprising:
the arrangement of claim 21,
wherein the apparatus is an EUV lithography apparatus.

33. The apparatus of claim 32, wherein the apparatus comprises an illumination device and an exposure element.

* * * * *